(12) United States Patent
Kim et al.

(10) Patent No.: US 6,333,227 B1
(45) Date of Patent: Dec. 25, 2001

(54) METHODS OF FORMING HEMISPHERICAL GRAIN SILICON ELECTRODES BY CRYSTALLIZING THE NECKS THEREOF

(75) Inventors: Sung-Tae Kim, Kyunggi-do; Kyung-Hoon Kim, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/378,682

(22) Filed: Aug. 20, 1999

(30) Foreign Application Priority Data

Aug. 28, 1998 (KR) .................................................. 98-35279

(51) Int. Cl.[7] ................................................. H01L 21/8242
(52) U.S. Cl. .......................... 438/255; 438/398; 438/655; 438/964; 257/308; 257/309
(58) Field of Search .................................... 257/308, 309; 438/255, 398, 665, 964, 655

(56) References Cited

U.S. PATENT DOCUMENTS

| | | | | |
|---|---|---|---|---|
| 3,900,345 | * | 8/1975 | Lesk | 148/1.5 |
| 4,144,100 | * | 3/1979 | MacIver et al. | 148/1.5 |
| 4,452,645 | * | 6/1984 | Chu et al. | 148/265 |
| 4,555,300 | * | 11/1985 | Arnold et al. | 156/613 |
| 4,799,991 | * | 1/1989 | Dockrey | 156/643 |
| 5,444,013 | * | 8/1995 | Akram et al. | 438/398 |
| 5,691,228 | * | 11/1997 | Ping et al. | 438/255 |
| 5,814,549 | * | 9/1998 | Wu | 438/398 |
| 5,837,582 | * | 11/1998 | Su | 438/255 |
| 5,877,052 | * | 3/1999 | Lin et al. | 438/238 |
| 6,010,942 | * | 1/2000 | Chien et al. | 438/396 |
| 6,013,555 | * | 1/2000 | Yew et al. | 438/398 |
| 6,020,260 | * | 2/2000 | Gardner | 438/657 |
| 6,027,970 | * | 2/2000 | Sharan et al. | 438/255 |
| 6,146,966 | * | 11/2000 | Hirota et al. | 438/398 |
| 2001/0001501 | * | 5/2001 | Lee et al. | 257/534 |

FOREIGN PATENT DOCUMENTS

| | | |
|---|---|---|
| 0 630 055 A2 | 3/1991 | (EP) . |
| 0 448 374 A1 | 9/1991 | (EP) . |
| 0 731 491 A2 | 9/1996 | (EP) . |
| 2758008 | * 12/1996 | (FR) . |
| 04280669 | * 10/1992 | (JP) . |
| 4419074A1 | * 12/1994 | (NL) . |

* cited by examiner

Primary Examiner—Eddie Lee
Assistant Examiner—Paul E Brock, II
(74) Attorney, Agent, or Firm—Myers Bigel Sibley & Sajovec

(57) ABSTRACT

The crystallinity of non-monocrystalline silicon necks that connect monocrystalline silicon hemispherical grains to an underlying electrode on an integrated circuit substrate is increased. Preferably, the non-monocrystalline silicon necks are crystallized. By crystallizing the non-monocrystalline silicon necks, the necks may be made more resistant to breaking and detaching during subsequent cleaning processes. The non-monocrystalline silicon necks preferably are crystallized by thermal annealing after fabrication of the hemispherical grain silicon.

18 Claims, 10 Drawing Sheets

METHODS OF FORMING HEMISPHERICAL GRAIN SILICON ELECTRODES BY CRYSTALLIZING THE NECKS THEREOF

FIELD OF THE INVENTION

This invention relates to methods of fabricating microelectronic devices, and more particularly to methods of fabricating integrated circuit electrodes and capacitors for microelectronic devices, and microelectronic devices so formed.

BACKGROUND OF THE INVENTION

Integrated circuit electrode structures are widely used in integrated circuit devices. For example, integrated circuit capacitors may be formed by a pair of spaced apart integrated circuit electrodes with a dielectric therebetween. As is well known to those having skill in the art, integrated circuit capacitors are widely used in Dynamic Random Access Memory (DRAM) devices and other integrated circuit devices.

As the integration density of DRAMs continues to increase, the surface area of an individual memory cell on the integrated circuit may decrease. This decrease may cause a decrease in the capacitance of the cell capacitors which may result in lower performance and/or increased soft error rates. Stacked capacitors, trench capacitors and other three dimensional capacitor structures have been used to increase the surface area of the capacitor electrodes per unit area of an integrated circuit substrate. It also is known to increase the effective surface area of capacitor electrodes by modifying the surface morphology thereof. In particular, a hemispherical grain (HSG) layer can be provided on a capacitor electrode, to thereby allow an increase in the surface area, and thereby allow an increase in capacitance.

Many techniques have been used to produce hemispherical grain silicon on the bottom electrode, also referred to as the storage electrode or storage node, of a capacitor in an integrated circuit. One technique forms hemispherical grain silicon by low pressure chemical vapor deposition from silane gas ($SiH_4$). This can increase the capacitance per unit substrate area by approximately 1.8 times compared to a similar shape capacitor that does not use hemispherical grain silicon. Unfortunately, it may be difficult to reliably and uniformly form the hemispherical grains by low pressure chemical vapor deposition.

Another technique is to utilize plasma deposition to form the hemispherical grains. Plasma deposition may be accomplished using radio frequency sputtering, direct current sputtering, electron cyclotron resonance, chemical vapor deposition, plasma enhanced chemical vapor deposition, radio frequency chemical vapor deposition or other techniques. Plasma deposition techniques may be accomplished at a wider range of deposition temperatures compared to chemical vapor deposition. For example, U.S. Pat. No. 5,753,559 to Yew et al. entitled *Method for Growing Hemispherical Grain Silicon*, discloses formation of a hemispherical grain silicon film at a temperature range of about 200° C. to about 500° C.

Still another technique uses molecular beam deposition which forms a hemispherical grain film by seeding hemispherical grain nuclei on amorphous silicon by molecular beam deposition. Annealing then is performed in ultrahigh vacuum, so that the amorphous silicon layer is converted into a layer of silicon having hemispherical grain polysilicon on its surface.

FIGS. 1A–1C are cross-sectional views of the formation of conventional hemispherical grain silicon electrodes. As shown in FIG. 1A, an amorphous silicon layer 4 is formed on an integrated circuit substrate or on an interlayer dielectric layer on an integrated circuit substrate. The amorphous silicon layer 4 may be formed by depositing n-type silicon at a predetermined temperature. The amorphous silicon layer 4 may be patterned using conventional photolithography to form electrodes such as storage electrodes. The substrate is then placed in a reaction chamber and a silicon source gas such as silane ($SiH_4$) or disilane ($Si_2H_6$) is supplied thereto, to thereby form seed crystals 5a on the surface of the amorphous silicon layer 4.

Referring now to FIG. 1B, after terminating the supply of silicon source gas, high temperature annealing is performed. During this annealing, silicon atoms in the amorphous silicon layer 4 migrate into the seed crystals 5a, as shown by the arrows in FIG. 1B, and thus the seed crystals 5a grow. Continued annealing allows the seed crystals 5a to further grow, to thereby form a desired size of hemispherical grain silicon 5, as shown in FIG. 1C. During formation of hemispherical grain silicon 5, a portion of the surface of amorphous silicon layer 4 also may be crystallized.

Unfortunately, as the silicon atoms in the amorphous silicon layer adjacent the seed crystals 5a migrate into the seed crystals 5a, a neck portion of the hemispherical grain silicon 5 may become thin, as may be seen by comparing FIG. 1C to FIG. 1B. It also will be understood that during formation of hemispherical grain silicon 5, some of the grains may have a small size compared to the desired size and may not include a neck portion.

FIG. 2 is a cross-sectional view of an electrode 4, such as a storage electrode of an integrated circuit capacitor, that is formed on an interlayer dielectric layer 2 on an integrated circuit substrate 1. The electrode 4 is connected to the integrated circuit substrate 1 through the contact hole 3 formed in the interlayer dielectric layer 2. Hemispherical grain silicon 5 is formed on the surface of the electrode 4 in a manner that was illustrated in FIGS. 1A through 1C.

As is well known to those having skill in the art, after forming the hemispherical grain silicon 5, a cleaning process generally is performed on the integrated circuit substrate. In particular, the integrated circuit substrate may be cleaned of native oxide before forming a dielectric film of a capacitor. Cleaning may be performed using a cleaning solution known as SC1, using hydrofluoric acid (HF) and/or using a diluted cleaning solution known as LAL. SC1 (Standard Cleaning-1) is a mixture containing $NH_4OH$, $H_2O_2$ and deionized water. LAL is a mixed solution containing $NH_4OH$ and HF.

As was described in connection with FIG. 1C, the neck portion of the hemispherical grain silicon 5 may become thin during the fabrication process thereof, as also illustrated in the enlarged portion of FIG. 2. Moreover, the neck portion generally is not completely monocrystalline. In particular, the hemispherical grains 5 generally are monocrystalline, but the neck portion may be non-monocrystalline silicon. As used herein, non-monocrystalline silicon includes amorphous silicon or polycrystalline silicon or a combination of at least two of amorphous, polysilicon and monocrystalline silicon. The cleaning solutions described above may readily etch amorphous silicon compared to monocrystalline silicon. SC1 especially may etch amorphous silicon compared to crystalline silicon. As a result, the neck portion of the hemispherical grain silicon 5 may be attacked during the cleaning process and thus may break and dislodge from the underlying electrode 4. As shown in FIG. 2, the dislodged hemispherical grain silicon may cause a bridge between adjacent electrodes 4.

SUMMARY OF THE INVENTION

It is therefore an object of the present invention to provide improved methods of forming integrated circuit electrode structures and integrated circuit electrode structures so formed.

It is another object of the present invention to provide improved methods of forming integrated circuit capacitors and DRAM devices, and capacitors and DRAM devices so formed.

It is yet another object of the present invention to provide methods of forming integrated circuit electrode structures including hemispherical grain silicon that can reduce breakage of the hemispherical grain silicon during subsequent fabrication processing, and integrated circuit electrode structures so formed.

These and other objects are provided, according to the present invention, by increasing the crystallinity of the non-monocrystalline silicon necks that connect monocrystalline silicon hemispherical grains to an underlying electrode on an integrated circuit substrate. Preferably, the non-monocrystalline silicon necks are crystallized. By crystallizing the non-monocrystalline silicon necks, the necks may be more resistant to breaking and detaching during subsequent cleaning processes. The non-monocrystalline silicon necks preferably are crystallized by thermal annealing after fabrication of the hemispherical grain silicon.

More specifically, methods of forming integrated circuit electrode structures according to the present invention form a plurality of monocrystalline silicon hemispherical grains on an electrode on an integrated circuit substrate, and a plurality of non-monocrystalline silicon necks that connect the hemispherical grains to the electrode. The plurality of non-monocrystalline necks are converted to a plurality of monocrystalline silicon necks. After conversion, the integrated circuit electrode structure may be cleaned in a solution that etches non-monocrystalline silicon, such that the monocrystalline silicon necks are not etched sufficiently to break and dislodge the hemispherical grains.

The non-monocrystalline silicon necks preferably are converted to monocrystalline silicon necks by thermal annealing. Thermal annealing may be performed in an oxygen ambient and may be performed at above 600° C.

Prior to converting the non-monocrystalline necks, the hemispherical grains may be coated to reduce migration of the hemispherical grains on the electrode during the converting step. Coating may be performed by thermally oxidizing the hemispherical grains. When the coating is formed by thermally oxidizing to form a native oxide on the hemispherical grains, the converting step preferably is performed by thermally annealing in an argon or nitrogen ambient. Alternatively, the hemispherical grains may be coated with at least one material selected from the group consisting of silicon oxide, silicon nitride, tantalum oxide and titanium oxide.

It also will be understood that during the conversion of the non-monocrystalline silicon necks to monocrystalline silicon necks, the surface of the electrode between the hemispherical grains also may be converted to monocrystalline silicon. This can provide additional etch resistance for the electrode during subsequent cleaning.

Prior to forming the monocrystalline silicon hemispherical grains, an integrated circuit memory cell may be formed in the integrated circuit substrate, and the electrode may be formed on the integrated circuit substrate, electrically connected to the integrated circuit memory cell. After converting the non-monocrystalline silicon necks to monocrystalline silicon necks, an insulating layer may be formed on the electrode including on the hemispherical grains. A second electrode then may be formed on the insulating layer opposite the electrode, to thereby form a capacitor for an integrated circuit memory cell.

Integrated circuit electrode structures according to the present invention include an integrated circuit substrate and an amorphous silicon electrode on the integrated circuit substrate. A plurality of spaced apart monocrystalline silicon necks extend from the amorphous silicon substrate. The plurality of monocrystalline silicon hemispherical grains also are included, a respective one of which is on a respective one of the plurality of spaced apart monocrystalline silicon necks. A monocrystalline silicon layer also may be included on the amorphous silicon electrode between the plurality of spaced apart monocrystalline silicon necks.

Accordingly, the fragile portion of the hemispherical grain silicon can be stabilized by crystallization. Improved methods of fabricating integrated circuit electrode structures, and electrode structures so fabricated, thereby may be provided.

DETAILED DESCRIPTION OF PREFERRED EMBODIMENTS

Figure 1A:
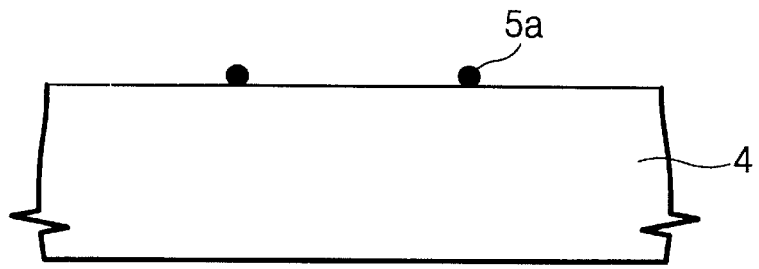
FIGS. 1A–1C are cross-sectional views of conventional methods of forming hemispherical grain silicon.
Figure 1B:
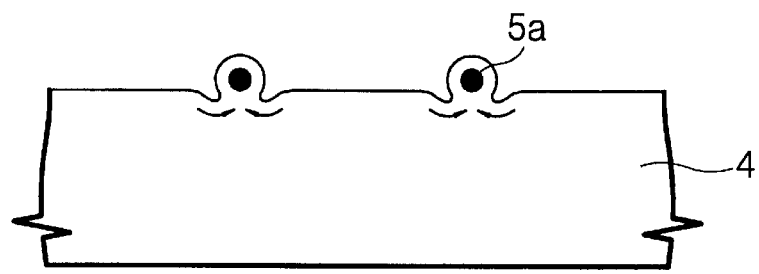
Figure 1C:
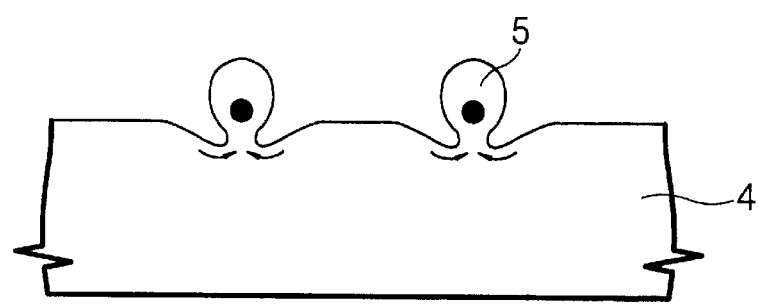
Figure 2:
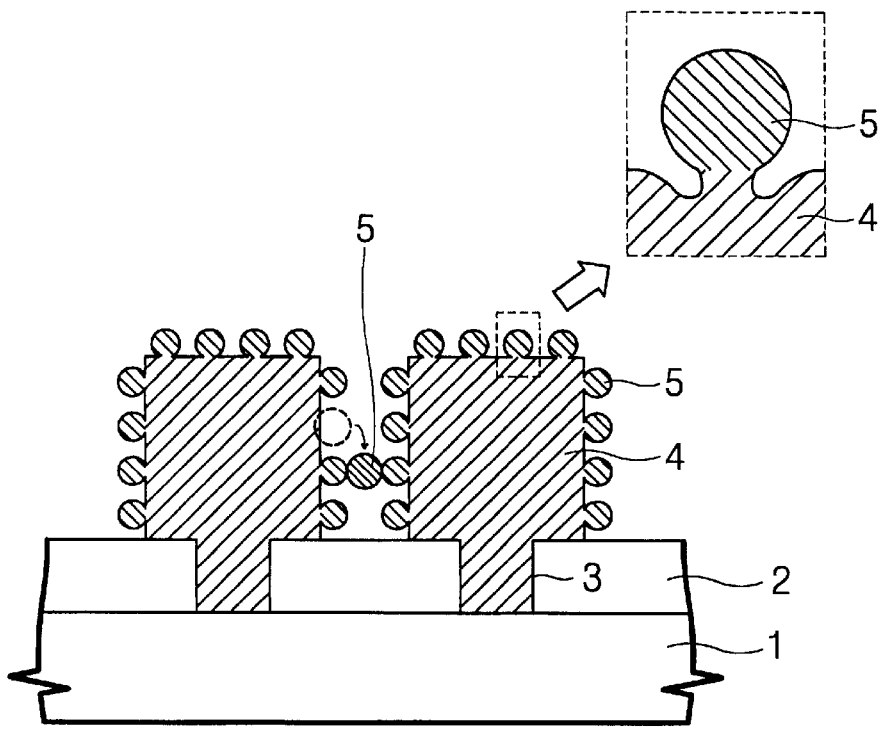
FIG. 2 is a cross-sectional view of a conventional electrode structure including hemispherical grain silicon.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 3A:
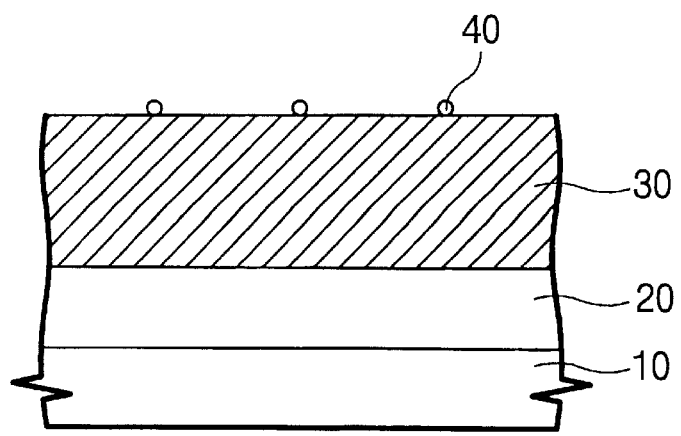
FIGS. 3A–3D are cross-sectional views of methods of forming integrated circuit electrode structures including hemispherical grain silicon, according to the present invention.

Referring now to FIGS. 3A–3D, a conceptual overview of methods of forming integrated circuit electrode structures according to the present invention will now be provided. Referring to FIG. 3A, an interlayer dielectric layer 20 and an electrode such as an amorphous silicon electrode 30, are formed on an integrated circuit substrate 10. The amorphous silicon electrode 30 may be doped with n-type impurities such as phosphorus, or it may be undoped. Alternatively, it may be doped with p-type impurities. When undoped amorphous silicon is used, dopants may be ion implanted after forming hemispherical grain silicon thereon. The ion implantation preferably is controlled carefully, so as not to damage the hemispherical grain silicon. Alternatively, when n-type doped amorphous silicon is formed, the deposition temperature of the silicon preferably is adjusted so as to form amorphous silicon, for example, in a range between about 510° C. and about 530° C. A doping concentration of about $1 \times 10^{20}$ to about $2 \times 10^{20}$ atoms/cm$^3$ may be used.

As is well known to those having skill in the art, it may be difficult to form uniform hemispherical grains of silicon on a polycrystalline silicon electrode compared to an amorphous silicon electrode. This difficulty may arise because the subsequently deposited silicon may be absorbed into the polycrystalline silicon rather than forming micro-crystalline nuclei on the polycrystalline silicon layer.

It also will be understood by those having skill in the art that a thin layer of native oxide may be present on the amorphous silicon layer 30, which may hinder the nucleation of hemispherical grains thereon. In particular, the native oxide layer may hinder the migration of silicon atoms during nucleation and growth. Although growth of hemispherical grain silicon may occur, there may be an increase in the resistance of the hemispherical grain silicon and of the underlying amorphous silicon layer. Accordingly, the surface of the underlying amorphous silicon layer 30 preferably is cleaned before initiating hemispherical grain silicon growth, to allow lower resistance.

The native oxide layer may be cleaned from the surface of the amorphous layer 30 using a variety of conventional techniques, including hydrofluoric acid dipping, hydrofluoric acid spin etching, vapor hydrofluoric acid cleaning and/or hydrogen plasma cleaning. Preferably, the surface of the underlying amorphous layer 30 is hydrogenated as a result of the cleaning operation. The hydrogenated surface can protect the surface of the amorphous silicon layer 30 from reoxidation.

The formation of the hemispherical grain silicon now will be described. Still referring to FIG. 3A, after the surface of the underlying amorphous silicon layer 30 is prepared, crystal nuclei 40 are formed on the amorphous silicon layer 30 using conventional techniques. For example, the crystal nuclei may be produced by low pressure chemical vapor deposition using silane (SiH$_4$), di-chloro silane (SiH$_2$Cl$_2$) or disilane (Si$_2$H$_6$) gas at a pressure of about $1 \times 10^{-4}$ to about $1 \times 10^{-5}$ torr and at a temperature of about 600° C. Alternatively, molecular beam deposition may be used to irradiate SiH$_4$ or Si$_2$H$_6$ molecules onto the amorphous silicon layer 30 at an irradiation temperature of about 600° C. Other conventional techniques may be used.

Figure 3B:
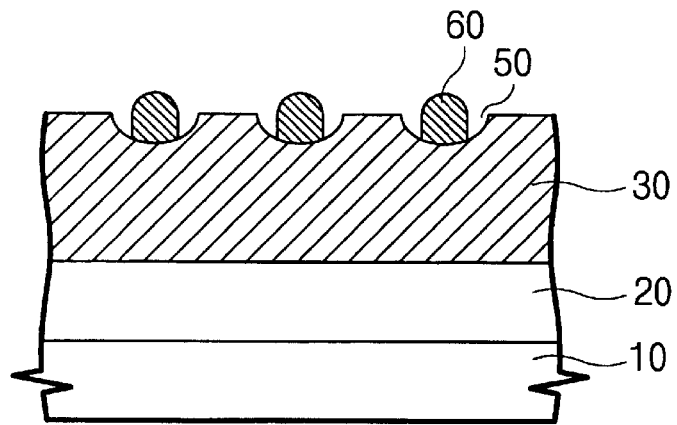

After forming the crystal nuclei 40, annealing preferably is carried out in a high vacuum environment of about $1 \times 10^{-6}$ to $1 \times 10^{-10}$ torr, preferably about $1 \times 10^{-7}$ torr, at substantially the same temperature as crystal nuclei formation, i.e., about 600° C., so as to allow increased throughput. Such annealing causes crystallites to grow from the crystal nuclei 40, so that hemispherical grain silicon is formed on the surface of the amorphous silicon layer as shown in FIG. 3B. In other words, the annealing allows silicon atoms around the amorphous silicon layer 30 to migrate into the crystal nuclei 40 and thereby to form first grains of hemispherical grain silicon 60. The annealing temperature preferably is adjusted so as not to cause thermal nucleation.

Figure 3C:
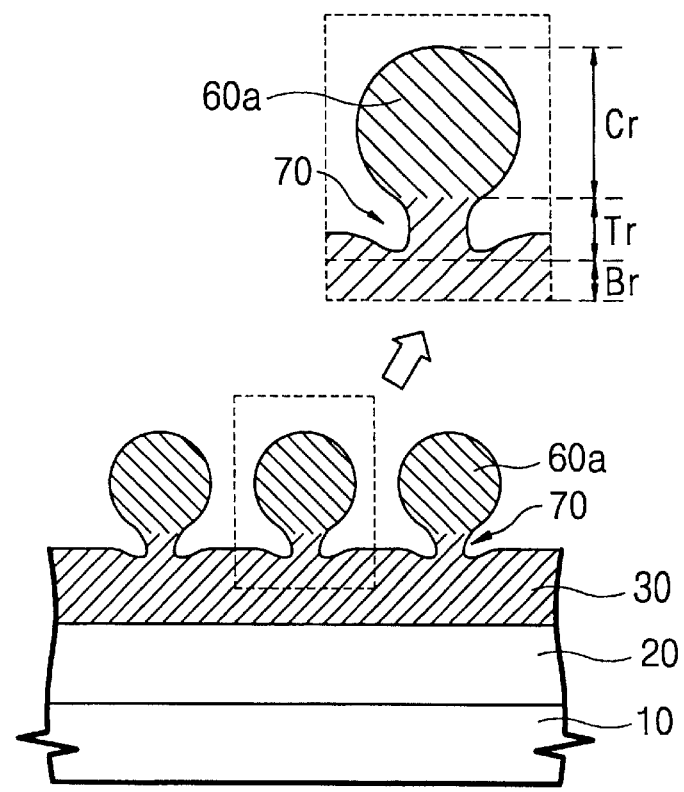
Figure 3D:
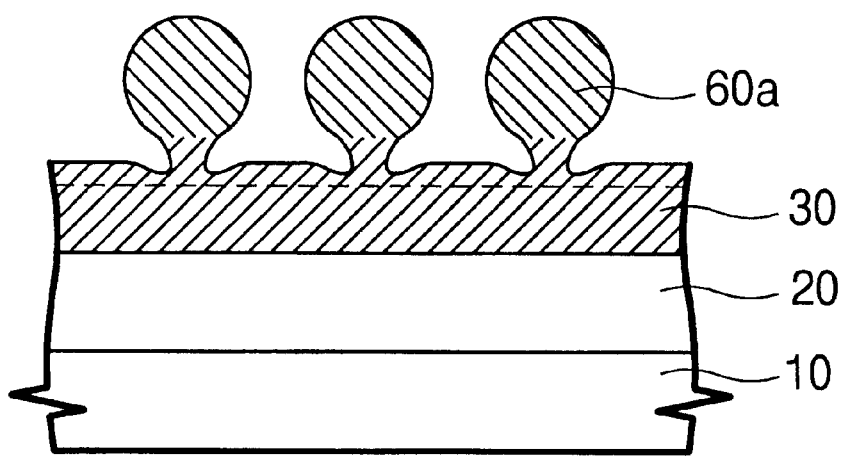

As is well known in the art, the average grain size and density of the crystal grains may depend upon the formation time and subsequent annealing steps. Longer formation time may result in the greater silicon atom migration and thus the first grains of hemispherical silicon 60 continue to grow to form the desired hemispherical grain silicon 60a as shown in FIG. 3C. The grain density may increase with increases in the deposition temperature of the substrate 10. In case of molecular beam deposition, the density may increase with an increase in the flux density of the silicon molecular beam.

As described above, the silicon atoms are concentrated into the crystal nuclei by surface diffusion, resulting in the formation of hemispherical-shaped monocrystalline silicon grains during the annealing process. The main source of silicon atom migration generally is not silicon atoms within the bulk of (i.e. deep within) the amorphous silicon layer 30, but rather generally is silicon atoms on the surface of the amorphous silicon layer 30 which have higher energy and are less stable compared to silicon atoms in the bulk. Stated differently, the bond force between atoms at the surface of the amorphous silicon layer 30 is weaker than that in the bulk. Such silicon atom migration initially causes recesses 50 around the hemispherical grain silicon 60 as shown in FIG. 3B. Continued migration creates the neck 70 of the desired hemispherical grain silicon 60a. The neck 70 may be fragile and very slim as shown in FIG. 3C. The slim neck may be subject to attack and etching during subsequent cleaning processes.

The amorphous silicon layer 30 having hemispherical silicon grain 60a illustrated inside the dotted line of FIG. 3C may be divided into three parts according to crystal characteristics: a crystal (monocrystalline) region (Cr) of hemispherical grain silicon 60a, surface layer including a transition region (Tr), and the bulk region (Br) of the amorphous silicon layer 30. The surface layer including the transition region (i.e, the neck 70) is non-monocrystalline. As used herein, non-monocrystalline includes amorphous or polycrystalline or a combination of at least two of amorphous, polycrystalline and monocrystalline. The non-monocrystalline silicon transition region Tr generally contains many lattice defects that may result from the aforementioned silicon atom migration.

According to the invention, to remove lattice defects of the surface region including the neck 70, a part of surface layer including the transition region is crystallized, preferably by performing high temperature annealing. See FIG. 3D). Reduced breaking of grains of silicon may be obtained during a cleaning process for removing the native oxide layer. Bridges between adjacent storage nodes therefore may be reduced and preferably may be eliminated.

The crystallization of the transition region and the surface layer may be carried out at high temperature, in nitrogen and/or argon ambients after forming a native oxide layer by breaking vacuum, or may be carried out at high temperature, in an oxygen ambient. Other annealing techniques also may be used. The native oxide layer can reduce and preferably can prevent the migration of silicon atoms. Thus, annealing in an oxygen ambient can provide a thin oxide layer on the surfaces of hemispherical grain silicon and the amorphous silicon layer, thereby reducing the migration of silicon atoms. Alternatively, an insulating layer may be deposited by conventional techniques before performing a cleaning process, for the same purpose as the aforementioned oxide layer.

It also will be understood that the present invention may be applied to electrodes other than capacitor electrodes. The present invention also may be applied to capacitor electrodes for integrated circuit devices other than the DRAM devices.

Figure 4A:
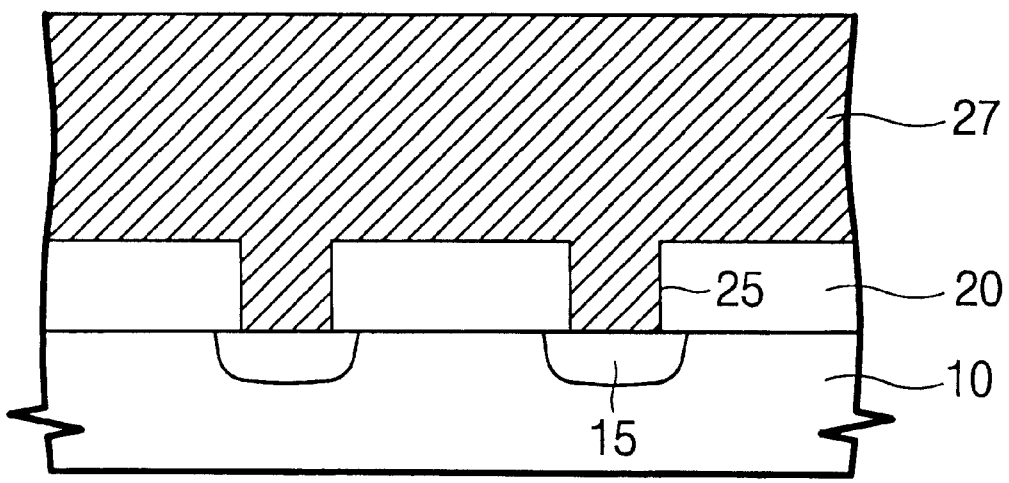
FIGS. 4A–4E are cross-sectional views of methods of forming integrated circuit memory devices including hemispherical grain silicon capacitor electrodes, according to the present invention.

A first embodiment of the present invention for forming a DRAM cell capacitor utilizing hemispherical grain silicon now will be described in detail with reference to FIG. 4A to FIG. 4E. FIG. 4A illustrates, in cross-section, a portion of an integrated circuit substrate 10 having already undergone several conventional process steps for forming a DRAM device. Referring to FIG. 4A, a source/drain region 15 of a memory cell transistor is formed in an integrated circuit substrate. An interlayer dielectric layer 20 preferably comprising silicon dioxide, is formed on the integrated circuit substrate 10 by conventional techniques. As is well known in the art, a field oxide layer, transfer gate transistor and its components, and bit line also may be formed, but are not shown in the drawings for clarity.

Still referring to FIG. 4A, the interlayer dielectric layer 20 then is etched to form contact holes 25 therein which contact active device regions such as source/drain regions 15 in the integrated circuit substrate 10. A conductive electrode 27 that may be used to form a storage node, such as an n-type (phosphorous doped) silicon layer, is deposited at a temperature that forms an amorphous silicon layer. Alternatively, an undoped silicon layer may be deposited and doping may be performed after forming hemispherical grain silicon. The doping may include ion implanting, and the doping conditions preferably are accurately controlled so as not to damage the already formed hemispherical grain silicon. In any case, the final doping concentration preferably is about $1 \times 10^{20}$ to about $2 \times 10^{20}$ atoms/cm$^3$. Heat treatment in a dopant-containing ambient also may be used for doping instead of ion implanting.

Figure 4B:
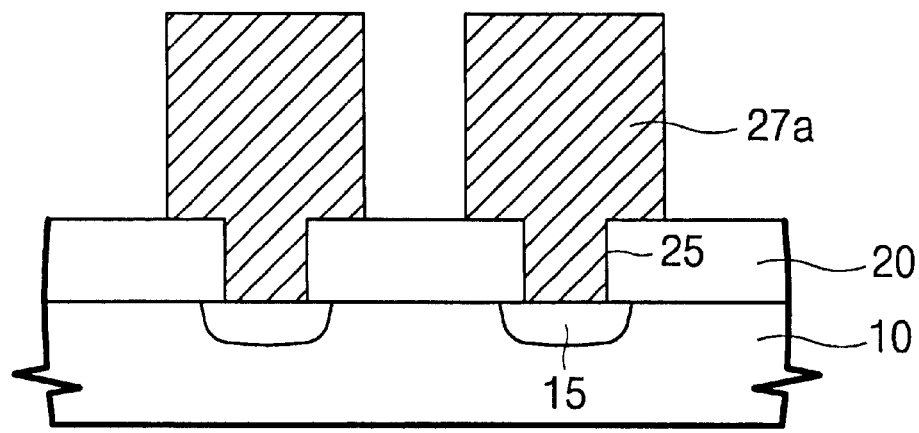

Referring to FIG. 4B, the amorphous silicon layer 27 is patterned to form at least one storage node 27a. After forming the storage node 27a, a native oxide layer may be cleaned from the surface of the amorphous silicon layer 30 by a variety of techniques including HF dipping, HF spin etching, vapor HF cleaning, and/or H$_2$ plasma cleaning. Preferably, the surface of the underlying amorphous silicon layer 30 is hydrogenated as a result of the cleaning operation, because the hydrogenated surface can protect the surface of the amorphous silicon layer 30 from reoxidation.

Figure 4C:
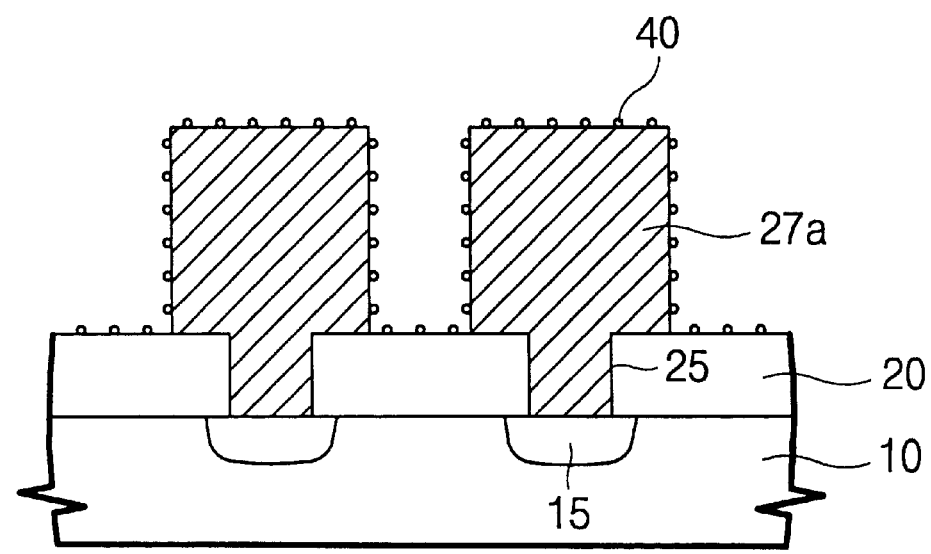

The formation of hemispherical grain silicon now will be described. Seeding crystal nuclei 40 are formed on the storage node 27a by low pressure chemical vapor deposition at a pressure of about $1 \times 10^{-4}$ to about $1 \times 10^{-5}$ torr, at a temperature of about 600° C., in SiH$_4$ and/or Si$_2$H$_6$ ambient as shown in FIG. 4C. As is well known in the art, the density of the crystal nuclei may increase with an increase in substrate deposition temperature and with an increase in silicon-containing gas pressure. Other conventional techniques may be used.

Figure 4D:
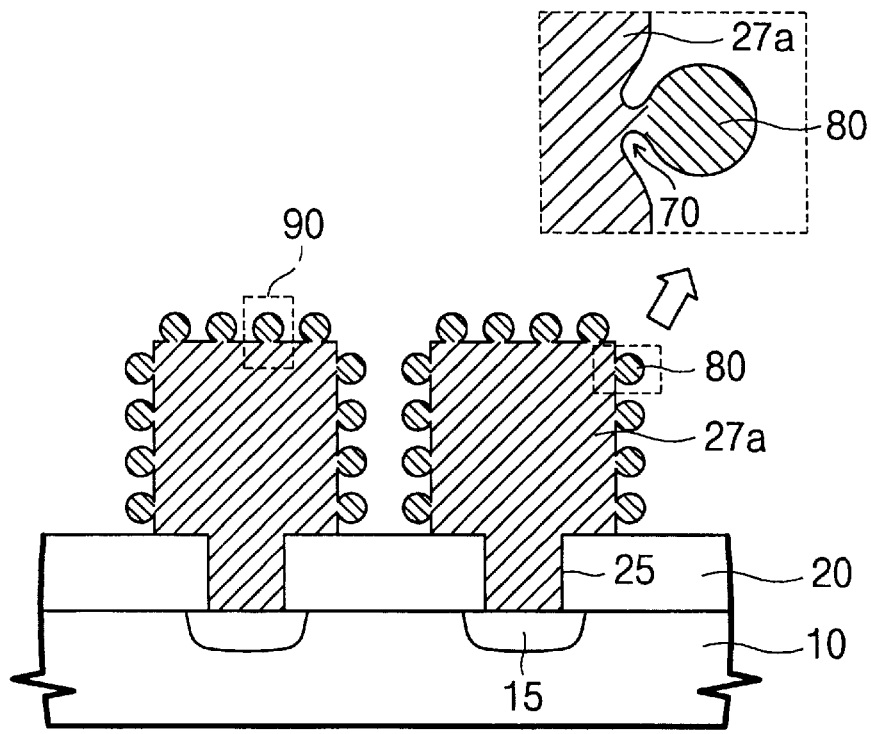

Referring to FIG. 4D, after forming the crystal nuclei 40, annealing is performed at a predetermined temperature, preferably at the same temperature as seeding the crystal nuclei. This annealing allows the crystal nuclei 40 to grow to hemispherical grain silicon 80 of uniform density and grain size. The density and grain size of the hemispherical grain silicon 80 may depend on various factors, such as the seeding time and the annealing process. Grain density of the hemispherical grain silicon 80 may increase with an increase in seeding time and the grain size of the hemispherical grain silicon also may increase with an increase in annealing time. The growth of hemispherical grain silicon results from migration of peripheral silicon atoms from the amorphous silicon into the crystal nuclei 40. Continued migration of atoms causes a recess around the grains 80, and this recess may cause the connecting neck 70 between the storage node 27a and the hemispherical grain silicon 80 to be thin and fragile. Furthermore, a non-monocrystalline transition region generally is formed in the neck. Thus, the neck may include many lattice defects.

Figure 5:
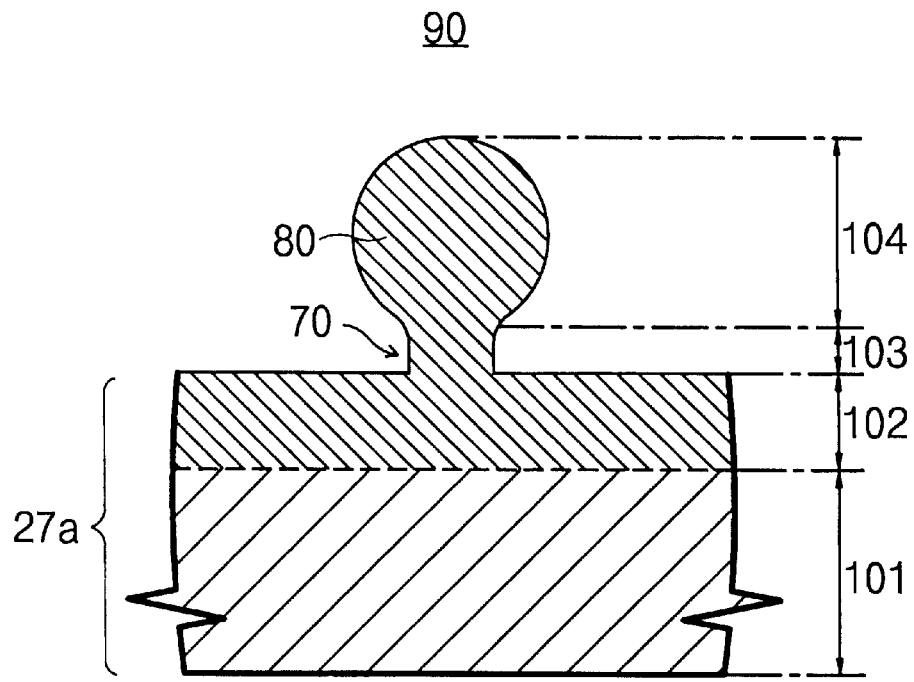
FIG. 5 is an enlarged view of a portion of FIG. 4D.

FIG. 5 schematically shows the storage node 27a having a hemispherical silicon grain 80 which may be divided into the amorphous bulk region 101, amorphous surface layer 102, amorphous polycrystalline/monocrystalline transition region 103 (neck), and monocrystalline region 104. As is well known in the art, amorphous silicon may be etched by a cleaning solution, compared to monocrystalline silicon. The surface layer 102 and the transition region 103 (neck) thus may be subject to attack by subsequent cleaning due to their incomplete crystal phase. As a result, hemispherical grain silicon 80 can be dislodged from the storage node 27a and thereby may cause a bridge between storage nodes. Therefore, it is desirable to reduce and preferably eliminate the lattice defects in the neck 70 and stabilize the neck.

Referring back to FIG. 4E, crystallization annealing is performed so as to crystallize the surface layer of the storage node 27a including the fragile and thin neck 70 of the hemispherical silicon grain 80. This crystallization annealing preferably is performed above about 600° C., for example at about 600° C. to about 650° C. In order to reduce and preferably prevent undesired migration of silicon atoms during this annealing process, an oxide layer may be formed on the silicon surface. To form the oxide layer, vacuum may be broken to form a native oxide and then heat treatment in an argon and/or nitrogen gas ambient may be carried out to perform the crystallization annealing. Another alternative is heat treating the silicon surface in an oxygen ambient to form a thin oxide layer. As described above, these oxide layers can reduce migration of silicon atoms during the annealing process, thereby protecting the neck 70 from being further thinned. Other techniques may be used.

Figure 4E:
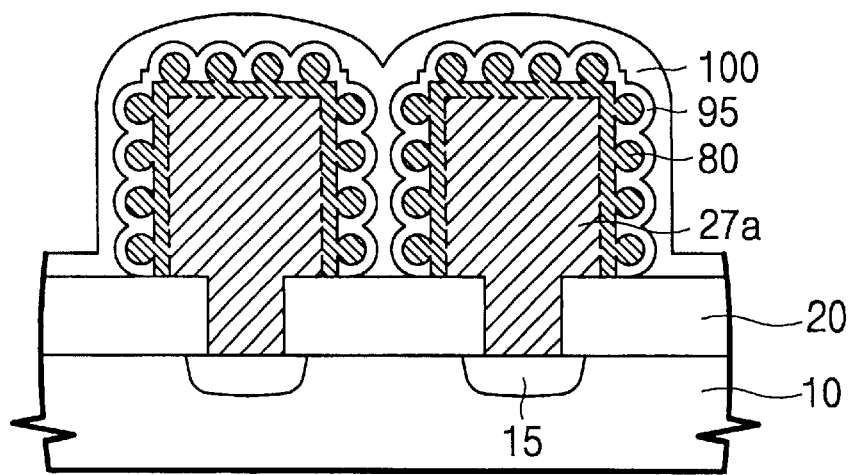

After high temperature annealing, cleaning may be carried out in SC1 (Standard Cleaning-1), diluted HF, and/or LAL solution. Due to the high temperature annealing, grains of silicon 80 preferably are not dislodged from the storage node 27a during this cleaning process, thereby reducing and preferably preventing a bridge between storage nodes. Finally, as shown in FIG. 4E, a capacitor insulating (dielectric) layer 95 and an upper (second) electrode 100 are formed, to complete the capacitor, using conventional techniques.

A second embodiment of the present invention now will be described with reference to FIG. 6A to FIG. 6F. The operations of FIGS. 6A to 6D correspond to FIGS. 4A to 4D and will not be described again. Then, as shown in FIG. 6E, an insulating layer 95' is formed on the storage node 27a and on the hemispherical grain silicon 80 by deposition before annealing to crystallize the transition region 103 and the surface layer 102 defined in FIG. 5.

Figure 6A:
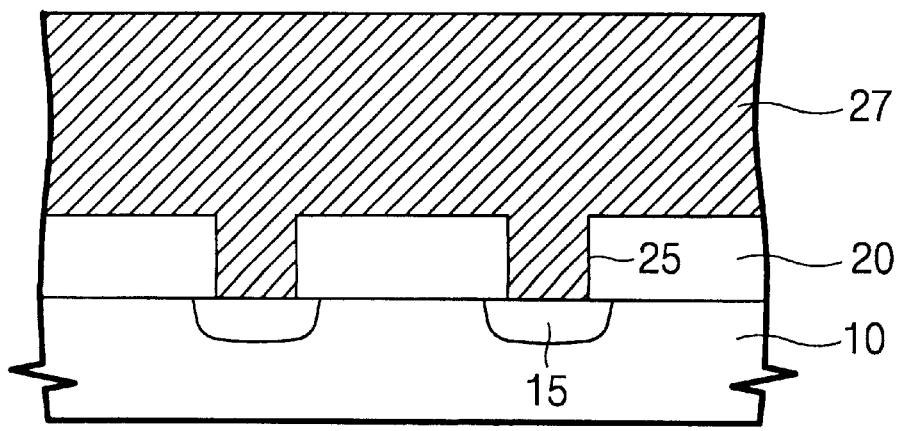
FIGS. 6A–6F are cross-sectional views showing alternate methods of forming integrated circuit memory devices including hemispherical grain silicon capacitor electrodes, according to the present invention.
Figure 6B:
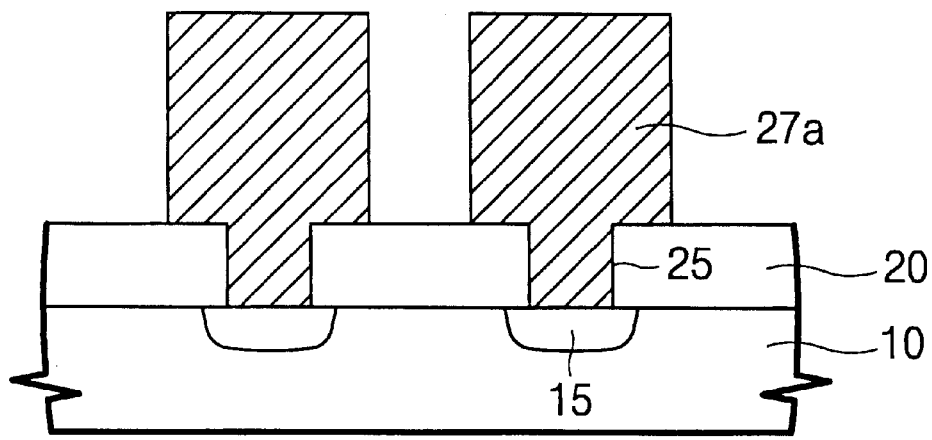
Figure 6C:
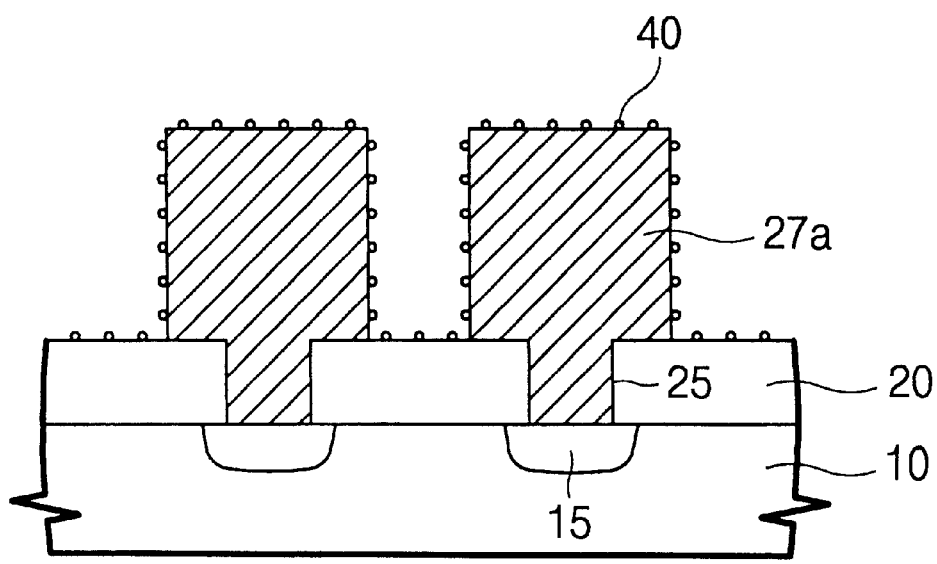
Figure 6D:
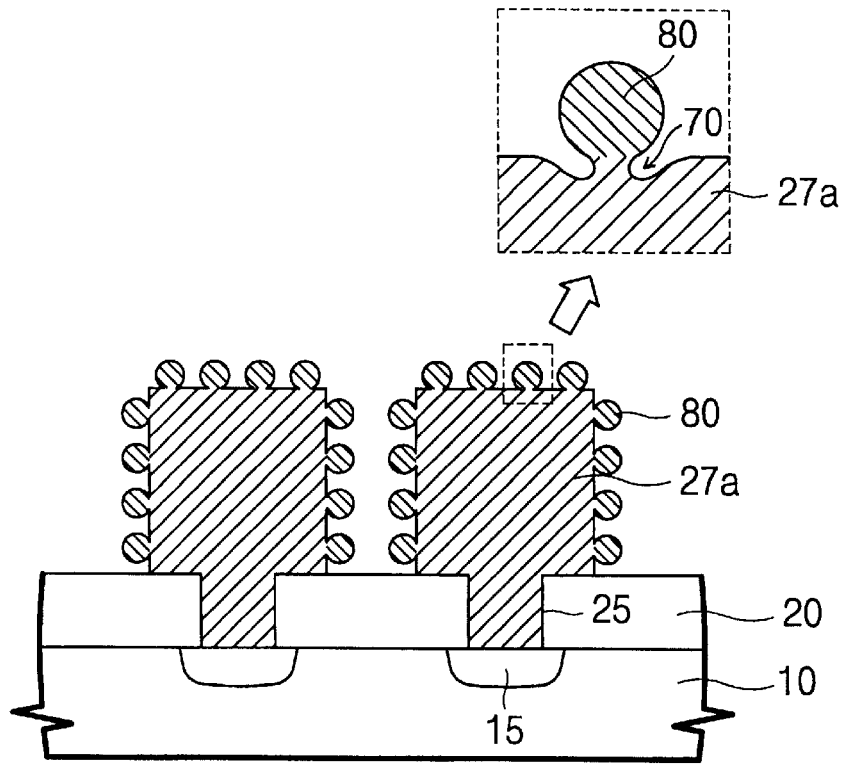
Figure 6E:
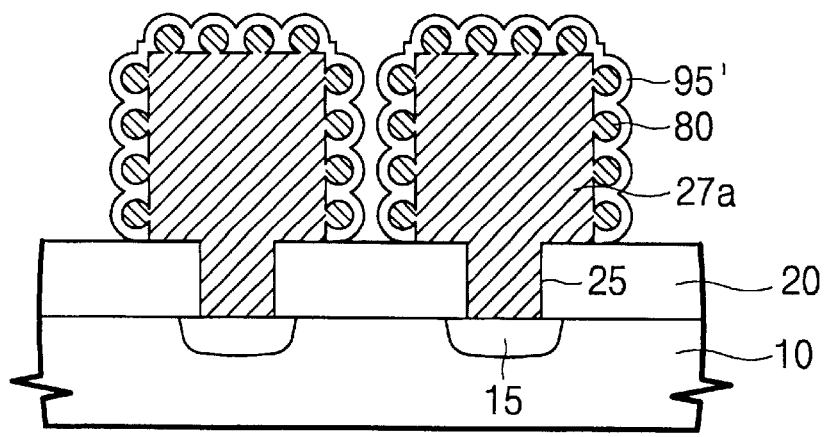

In particular, referring to FIG. 6E, after forming hemispherical grain silicon 80 on the surface of the storage node 27a, an insulating layer 95' is formed on the surface of the storage node 27a and on hemispherical grain silicon 80. This insulating layer 95' reduces and preferably prevents undesirable migration of the silicon atoms during subsequent high temperature annealing. This insulating layer formation process preferably is carried out in the same processing chamber as the high temperature annealing and thus can provide efficient processing.

Figure 6F:
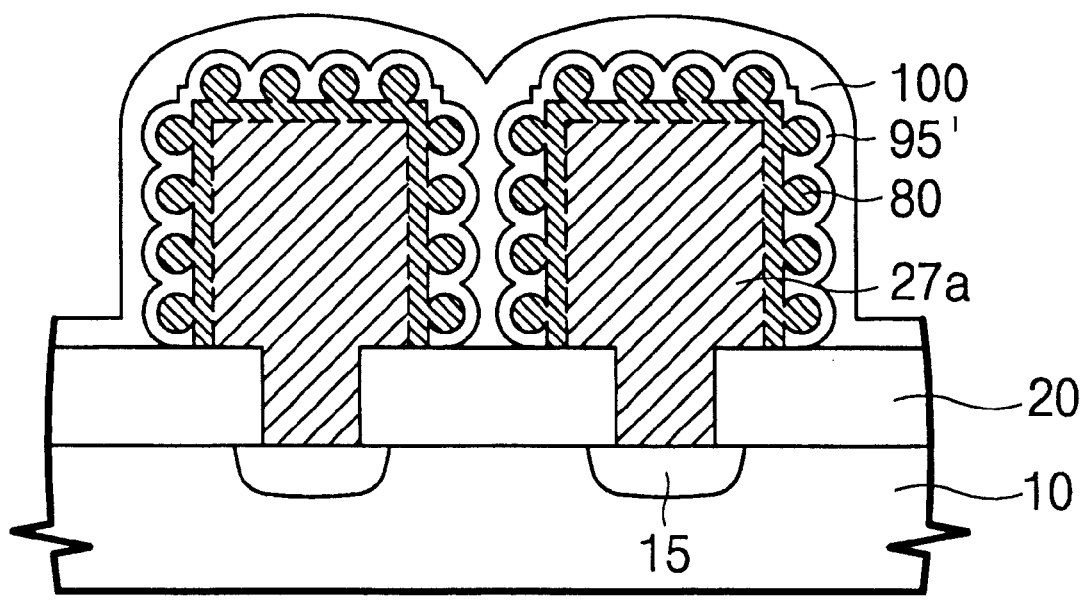

The insulating layer 95' may include a silicon oxide layer, a silicon nitride layer, $Ta_2O_5$, and/or $TiO_2$ which are formed by deposition. Other materials and techniques may be used. If the insulating layer is formed of silicon nitride, the step of forming a dielectric film of a capacitor may be skipped because the insulating layer 95' may function as the capacitor dielectric. After forming the insulating layer 95', high temperature annealing is carried out as was described above. As shown in FIG. 6F, the capacitor is completed as was described above.

Accordingly, the fragile neck portion of hemispherical grain silicon may be crystallized using a high temperature anneal. By converting the non-monocrystalline necks to monocrystalline silicon necks, resistance to cleaning solutions that are used in subsequent processing may be improved. The monocrystalline silicon necks preferably do not break and dislodge the hemispherical grains. Accordingly, increased capacitance can be obtained by utilizing hemispherical grain silicon on the surfaces of a DRAM device storage node, while allowing reduced formation of bridges between adjacent storage nodes during subsequent processing. Improved performance and/or increased yields thereby may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit electrode structure comprising the steps of:
    forming a plurality of monocrystalline silicon hemispherical grains on an electrode on an integrated circuit substrate, and a plurality of non-monocrystalline silicon necks that connect the hemispherical grains to the electrode; then
    converting the plurality of non-monocrystalline silicon necks to a plurality of monocrystalline silicon necks; and then
    cleaning the plurality of monocrystalline silicon hemispherical grains in a solution that etches non-monocrystalline silicon, such that the monocrystalline silicon necks are not etched sufficiently to break and dislodge the hemispherical grains.

2. A method according to claim 1 wherein the following step is performed between the steps of forming and converting:
    coating the hemispherical grains to reduce migration of the hemispherical grains on the electrode during the converting step.

3. A method according to claim 1 wherein the converting step comprises the step of thermally annealing the integrated circuit substrate including the non-monocrystalline silicon necks, prior to performing the cleaning step.

4. A method according to claim 3 wherein the thermal annealing is performed in an oxygen ambient.

5. A method according to claim 3 wherein the thermal annealing is performed at above 600° C.

6. A method according to claim 2 wherein the coating step comprises the step of thermally oxidizing the hemispherical grains.

7. A method according to claim 2 wherein the coating step comprises the step of coating the hemispherical grains with at least one material selected from the group consisting of silicon oxide, silicon nitride, tantalum oxide and titanium oxide.

8. A method according to claim 2 wherein the coating step comprises the step of forming a native oxide on the hemispherical grains and wherein the converting step comprises the step of thermally annealing the integrated circuit substrate including the non-monocrystalline silicon necks, in an argon or nitrogen ambient.

9. A method according to claim 1 wherein the converting step further comprises the step of converting the surface of the electrode between the hemispherical grains to monocrystalline silicon.

10. A method according to claim 1 wherein the forming step is preceded by the steps of forming an integrated circuit memory cell in the integrated circuit substrate and forming the electrode on the integrated circuit substrate, electrically connected to the integrated circuit memory cell.

11. A method according to claim 10 wherein the cleaning step is followed by the step of forming an insulating layer on the electrode including on the hemispherical grains and forming a second electrode on the insulating layer opposite the electrode, to thereby form a capacitor for an integrated circuit memory cell.

12. A method according to claim 1 wherein the cleaning step is followed by the step of forming an insulating layer on the electrode including on the hemispherical grains and forming a second electrode on the insulating layer opposite the electrode, to thereby form a capacitor for an integrated circuit.

13. A method of forming an integrated circuit electrode structure comprising the steps of:
    forming a plurality of monocrystalline silicon hemispherical grains on an amorphous silicon electrode on an integrated circuit substrate, and a plurality of non-monocrystalline silicon necks that connect the hemispherical grains to the amorphous silicon electrode; then
    increasing the crystallinity of the plurality of non-monocrystalline silicon necks; and then
    cleaning the plurality of monocrystalline silicon hemispherical grains in a solution that etches non-monocrystalline silicon, such that the necks of increased crystallinity are not etched sufficiently to break and dislodge the hemispherical grains.

14. A method according to claim 13 wherein the following step is performed between the steps of forming and increasing the crystallinity:
    coating the hemispherical grains to reduce migration of the hemispherical grains on the electrode during the step of increasing the crystallinity.

15. A method according to claim 13 wherein the step of increasing the crystallinity further comprises the step of crystallizing the surface of the amorphous silicon electrode between the hemispherical grains.

16. A method according to claim 13 wherein the step of increasing the crystallinity comprises the step of crystallizing the plurality of non-monocrystalline silicon necks.

17. A method according to claim 1 wherein the cleaning step comprises the step of cleaning the plurality of monocrystalline silicon hemispherical grains in a solution that selectively etches non-monocrystalline silicon at a faster rate than monocrystalline silicon.

18. A method according to claim 13 wherein the cleaning step comprises the step of cleaning the plurality of monocrystalline silicon hemispherical grains in a solution that selectively etches non-monocrystalline silicon at a faster rate than monocrystalline silicon.

* * * * *